United States Patent [19]

Kuo et al.

[11] Patent Number: 5,644,531

[45] Date of Patent: Jul. 1, 1997

[54] PROGRAM ALGORITHM FOR LOW VOLTAGE SINGLE POWER SUPPLY FLASH MEMORIES

[75] Inventors: Tiao Hua Kuo, San Jose; Chung K. Chang, Santa Clara; Johnny Chen, Cupertino; James C. Y. Yu, San Jose, all of Calif.

[73] Assignee: Advanced Micro Devices, Inc., Sunnyvale, Calif.

[21] Appl. No.: 551,705

[22] Filed: Nov. 1, 1995

[51] Int. Cl.[6] .................................................. G11C 7/00
[52] U.S. Cl. .............................. 365/185.11; 365/230.03
[58] Field of Search ........................ 365/185.11, 230.03, 365/185.33

[56] References Cited

U.S. PATENT DOCUMENTS 5,361,343  11/1994  Kosonocky et al. ............... 365/185.11
5,508,968  4/1996  Collins et al. ...................... 365/230.03

*Primary Examiner*—Son T. Dinh
*Attorney, Agent, or Firm*—Fliesler, Dubb, Meyer & Lovejoy, LLP

[57] ABSTRACT

A programming algorithm for a flash memory wherein programming circuitry is subdivided into a set of separately controllable groups. The algorithm detects a number of logic zeros to be programmed into a flash cell array by each group and switches among the groups such that a number of simultaneously programmed cells in the flash cell array does not exceed a predetermined number and such that maximum available programming current is used to enhance programming speed.

14 Claims, 8 Drawing Sheets

FIG. 7

| | | Low Byte Det. | High Byte Det. | Word Det. | 1st PGM subpulse | 2nd. PGM subpulse | 3rd. PGM subpulse | 4th PGM subpulse | Total PGM subpulse |
|---|---|---|---|---|---|---|---|---|---|
| Byte Mode | Low Byte | H | x | L | S0,S1 | - | - | - | 1 |
| | Low Byte | L | x | L | S0 | S1 | - | - | 2 |
| | High Byte | x | H | L | S2,S3 | - | - | - | 1 |
| | High Byte | x | L | L | S2 | S3 | - | - | 2 |
| Word Mode | Word | H | H | H | S0,S1,S2,S3 | - | - | - | 1 |
| | Word | H | H | L | S0,S1 | S2,S3 | - | - | 2 |
| | Word | H | L | L | S0,S1 | S2 | S3 | - | 3 |
| | Word | L | H | L | S0 | S1 | S2,S3 | - | 3 |
| | Word | L | L | L | S0 | S1 | S2 | S3 | 4 |

PROGRAM ALGORITHM FOR LOW VOLTAGE SINGLE POWER SUPPLY FLASH MEMORIES

BACKGROUND OF THE INVENTION

1. Field of Invention

The present invention pertains to the field of flash memories. More particularly, this invention relates to a program algorithm for low voltage single power supply flash memories.

2. Art Background

Flash memories are commonly employed in a wide variety of computer systems to provide non-volatile information storage. Prior flash memories typically include program circuitry for programming information into the flash memory cells as well as erase circuitry for erasing the memory cells. However, the voltage supply levels required by such program and erase circuitry differs from the voltage supply levels that are typically available from a computer system power supply.

Some prior flash memories require multiple voltage supplies to accommodate the program and erase circuitry. For example, one prior flash memory requires a VCC supply voltage and a separate VPP supply voltage for the program circuitry. Unfortunately, such a requirement of dual voltage supplies typically increases the complexity of power system design for computer systems that employ such dual supply flash memories and increases the overall cost of such systems.

On the other hand, single power supply flash memories commonly contain specialized circuitry that generates the appropriate voltage levels and electrical current levels required to program and erase the individual flash memory cells. For example, such flash memories typically include charge pump circuitry that converts a single electrical supply voltage into the appropriate voltage level required to drive the inputs to the flash memory cells during programming.

More recent computer systems, such as portable computers, employ integrated circuits and other devices that function with relatively low voltage supply (VCC) levels in comparison to earlier systems. For example, prior notebook computer systems that employed a 5 v VCC supply are now evolving toward 3 v or lower VCC supplies.

Unfortunately, such low levels of electrical supply voltage impose a practical limit on the amount of electrical programming current that can be generated by charge pump circuitry on the flash memory. Such a limit on available programming current may reduce the overall speed of such flash memories by limiting the number of flash cells that can be programmed simultaneously.

Theoretically, a larger and more complex implementation of charge pump circuitry would provide the necessary electrical current required to program entire bytes or words of flash memory cells simultaneously. However, such larger and more complex charge pump circuitry typically consumes large areas of an integrated circuit die. Such large amounts of integrated circuit die space dedicated to a charge pump typically reduces the available die space available for flash memory cells and associated access circuitry which thereby limits the overall storage capacity of such a flash memory. On the other hand, such large amounts of die space may require a significant increase in the overall size of the integrated circuit die which increases manufacturing costs.

SUMMARY AND OBJECTS OF THE INVENTION

One object of the present invention is to provide a new program algorithm for a single power supply flash memory.

Another object of the present invention is to provide a program algorithm that efficiently distributes the available programming current to only the flash memory cells that require programming.

Another object of the present invention is to provide a programming algorithm that enables the fastest programming speeds given the limits on available programming current.

Another object of the present invention is to provide a program algorithm for a low voltage single power supply flash memory that operates in both byte mode and word mode.

These and other objects are provided by a programming algorithm for a flash memory. The data input buffer and programming circuitry in the flash memory is subdivided into a set of separately controllable groups. The algorithm detects a number of logic zeros to be programmed into a flash cell array by each group. The algorithm switches among the groups such that a number of simultaneously programmed cells in the flash cell array does not exceed a predetermined number such that maximum current capacity is used and such that maximum current capacity is used for programming. The predetermined number is selected to prevent the overtaxing of charge pump circuitry in the flash memory while obtaining maximum programming speed.

Other objects, features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which:

FIG. 7 illustrates the states of the program control state machine for both byte mode and word mode programming on the flash cell array;

DETAILED DESCRIPTION

Figure 1:
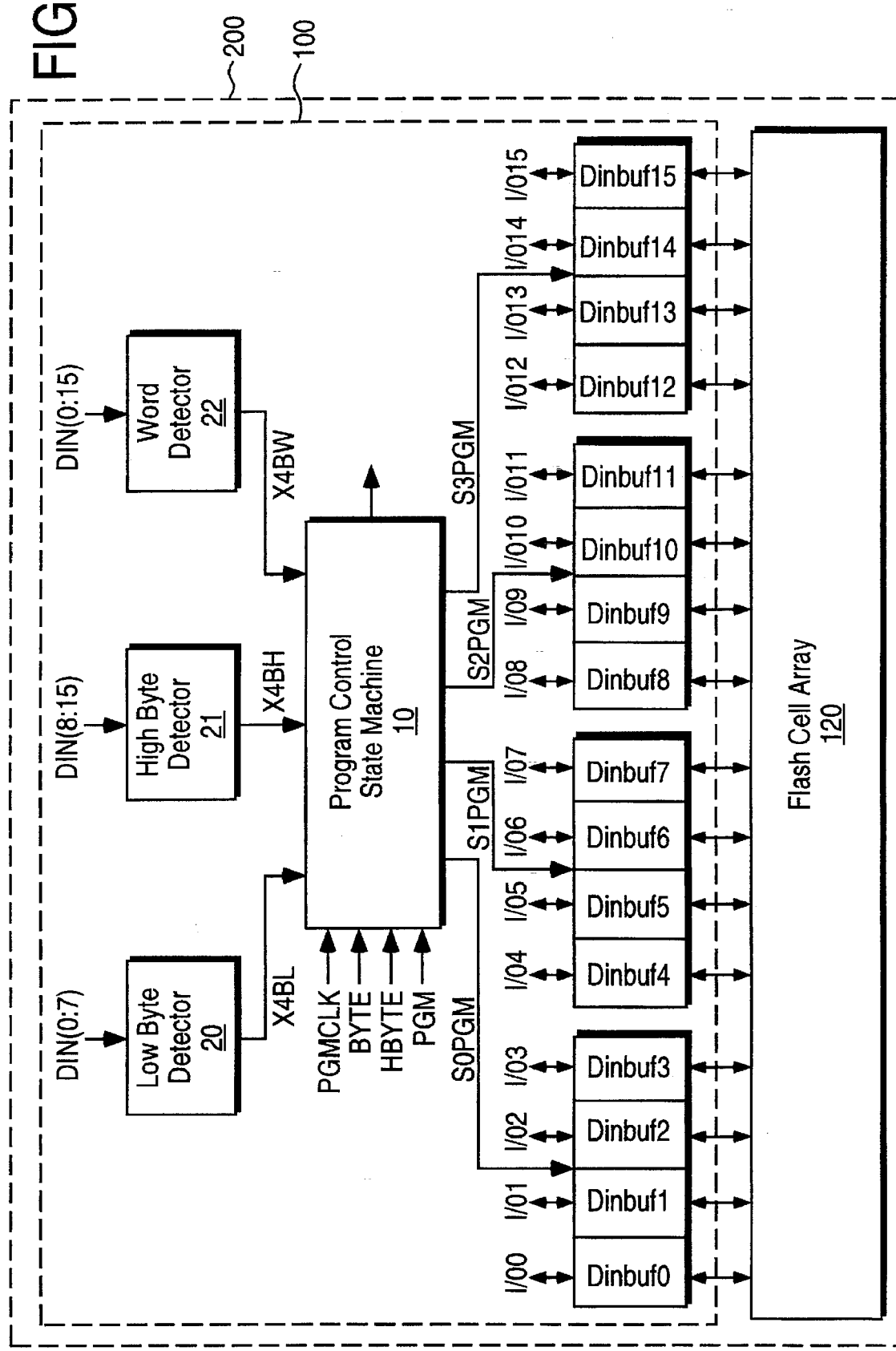
FIG. 1 illustrates a single power supply flash memory including a program circuit and a flash cell array.

FIG. 1 illustrates a single power supply flash memory 200 including a program circuit 100 and a flash cell array 120. The program circuit 100 implements a program algorithm for the single power supply flash memory 200 that enables operation at low VCC supply levels.

The program circuit 100 includes a program control state machine 10, a low byte detector 20, a high byte detector 21 and a word detector 22. The program circuit 100 also includes set of data input buffer circuits which are referred to as Dinbuf0 through Dinbuf15 (Dinbuf0–15). The Dinbuf0–15 circuits are coupled to a corresponding set of input/output pods via a set of input/output lines which are referred to as lines I/O0 through I/O15 (I/O0–15). The Dinbuf0–15 circuits drive the bit lines of the flash cell array 120.

For one embodiment, the flash cell array 120 is 16 bits wide and is accessible in both byte and word modes. Each 16 bit word of the flash cell array coupled to the Dinbuf0–15 circuits is subdivided into four groups referred to as group0 throughout group3 (group0–3). The group0 includes the data input buffers Dinbuf0–3, the group1 includes Dinbuf4–7, the group2 includes Dinbuf8–11, and the group3 includes Dinbuf12–15.

The group0 and the group1 data input buffers are combined into a low byte of a programming word or a programming byte in the byte mode for the flash cell array 120 while the group2 and the group3 input buffers are combined into a high byte of a programming word. An entire programming word or a programming byte in the byte mode for the flash cell array 120 includes all four data input buffer groups, group0–3.

The program control state machine 10 selects one or more of the data input buffer groups0–3 to drive the corresponding bit lines of the flash cell array 120 during programming operations. The program control state machine 10 switches among the groups0–3 via a set of control signals S0PGM through S3PGM. The program control state machine 10 switches as many of the data input buffer groups0–3 as is required to program an entire byte or word according to the content of the programming data targeted for the flash cell array 120 and according to whether the program circuit 100 is operating in a byte mode or a word mode.

Each Dinbuf0–15 contains a program circuit that drives a corresponding set of bit lines in the flash cell array 120. The program control state machine 10 activates the groups0–3 in a sequence that prevents the programming circuits in the Dinbufs 0–15 from overtaxing the electrical current output of drain pump circuitry (not shown) that drives the flash cell array 120 during programming.

For one embodiment, the drain pump circuitry for the flash memory 200 is capable of supplying approximately 2.5 milliamps of programming current at 5 v from a voltage supply VCC that varies between 2.7 v and 3.6 v. The 2.5 milliamps is sufficient to drive the drains of up to 5 flash memory cells during a program operation.

The word lines and the Y pass gates of the flash cell array 120 are not switched until after the program control state machine 10 completes the necessary switching among the groups0–3 to complete a programming operation. No program verify operations in the flash memory 200 occur between switching of groups0–3 in order to save programming time. Programming verification operations are performed after completion of a whole word or whole byte program operation.

If a program verify operation fails then the whole word or byte is reprogrammed according to the same program process. During such reprogramming only failed program cells are programmed on subsequent program cycles. This prevents overprogramming of the flash cells that were correctly programmed during the initial program cycle.

The low byte detector 20, the high byte detector 21 and the word detector 22 generate a set of control signals X4BL, X4BH, and X4BW, respectively. The program control state machine 10 uses the control signals X4BL, X4BH, and X4BW, along with other information to determine the appropriate switching sequence for the groups 0–3.

The low byte detector 20 receives a set of signals Din(0:7) that indicate the actual logic "0" states to be programmed into the low byte of the flash cell array 120. If the low byte detector 20 detects 5 or fewer zeros in the Din(0:7) data then the control signal X4BL is asserted high. If the low byte detector 20 detects more than 5 zeros in the Din(0:7) data then the control signal X4BL is asserted low.

Similarly, the high byte detector 21 receives a set of signals Din(8:15) that indicate the actual logic "0" states to be programmed into the high byte of the flash cell array 120. The high byte detector 21 asserts the control signal X4BH high if 5 or fewer zeros are detected in the Din(8:15) data and asserts the control signal X4BH low otherwise.

The word detector 22 receives the signals Din(0:15) and detects the actual logic "0" states to be programmed into a word of the flash cell array 120. The word detector 22 asserts the control signal X4BW high if 5 or fewer zeros are detected in the Din(0:15) data and asserts the control signal X4BW low otherwise.

The program control state machine 10 uses the control signals X4BL, X4BH and X4BW, along with a BYTE signal, and an HBYTE signal to determine the appropriate sequence for allowing groups0–3 to program the flash cell array 120. The program control state machine 10 is clocked by a programming clock (PGMCLK). The BYTE signal indicates whether the flash memory 200 is being accesses in byte or word mode. The HBYTE signal indicates whether the high byte or the low byte in the flash cell array 120 is being programmed if the byte mode is indicated.

The program control state machine 10 generates a set of programming control signals for the groups0–3. The programming control signals include an S0PGM signal that selects the group0, an S1PGM signal that selects the group1, an S2PGM signal that selects the group2, and an S3PGM control signal that selects the group3. The S0–S3PGM control signals also determine when the program control state machine 10 terminates a program process after completion of a program operation on the flash cell array 120.

Figure 2:
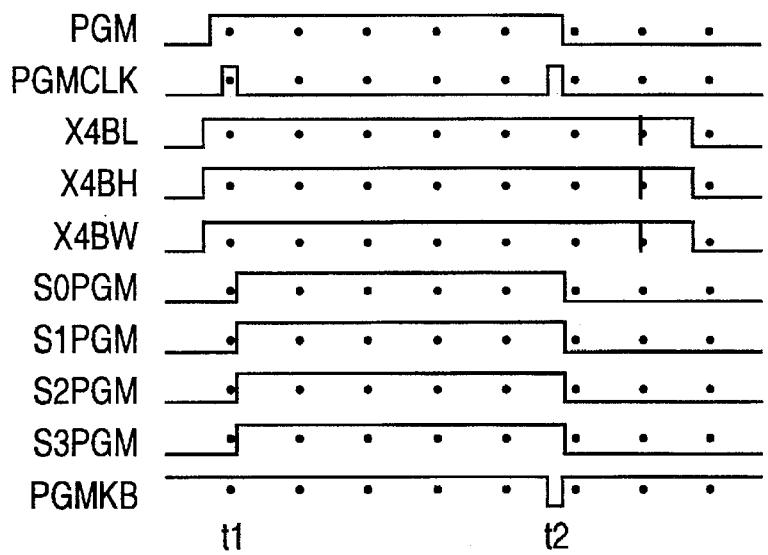
FIG. 2 illustrates a sequence in which the program control state machine selects the programming groups 0–3 when the word detector detects 5 or fewer zeros to be programmed in the flash cell array.

FIG. 2 illustrates a sequence for word mode programming in which the program control state machine 10 selects the groups 0–3 when the word detector 22 detects 5 or fewer zeros to be programmed in the flash cell array 120. In this programming sequence, the S0PGM-S3PGM signals are activated simultaneously between times t1 and t2 to enable simultaneous programming of the flash cell array 120 by the groups 0–3.

Figure 3:
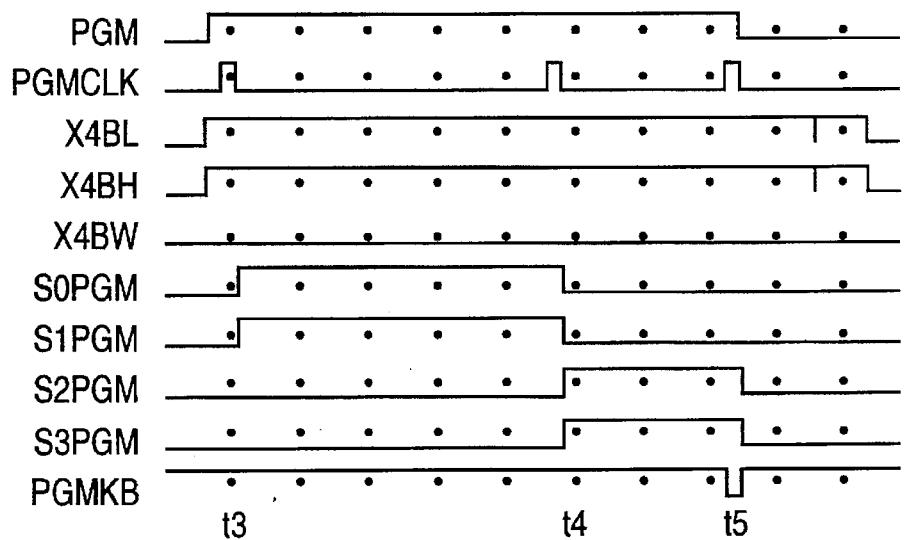
FIG. 3 illustrates a sequence in which the program control state machine selects the groups 0–3 when the low byte detector and the high byte detector each detect 5 or fewer zeros for programming wherein the combination of zeros and the high and the low bytes is greater than 5.

FIG. 3 illustrates a sequence for word mode programming in which the program control state machine 10 selects the groups 0–3 when the low byte detector 20 detects 5 or fewer zeros for programming and the high byte detector 21 detects 5 or fewer zeros for programming wherein the combination of zeros and the high and the low bytes is greater than 5. In this programming sequence, the program control state machine activates the S0PGM and S1PGM control signals between times t3 and t4 to enable group 0 and 1 programming on the flash cell array 120. Between times t4 and t5, the program control state machine 10 activates the S2PGM and S3PGM control signals to activate programming by the groups 2 and 3.

Figure 4:
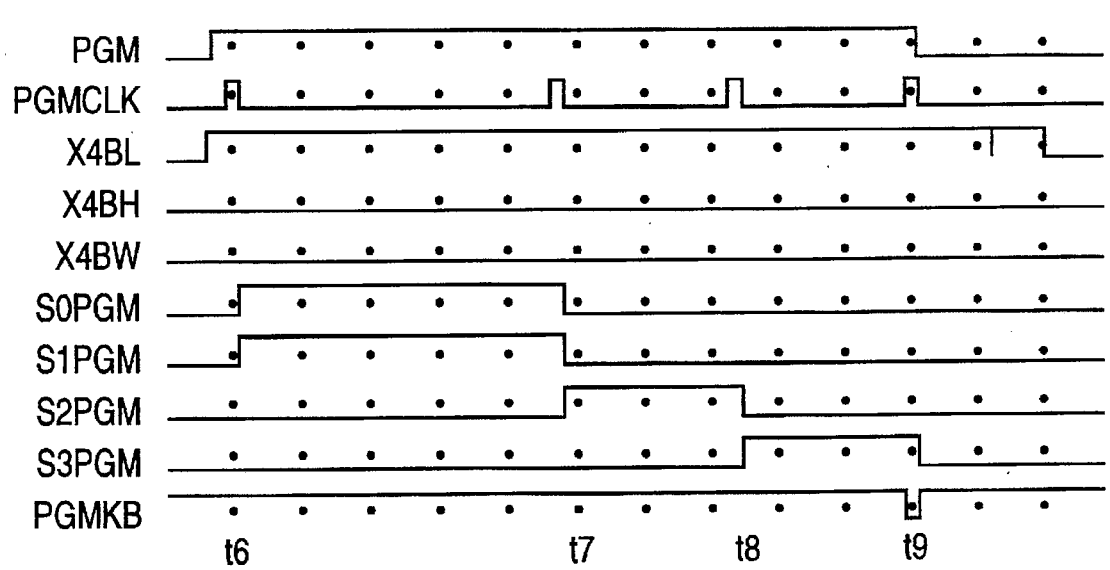
FIG. 4 illustrates a sequence in which the program control state machine selects the groups 0–3 when the low byte detector detects 5 or fewer zeros be programmed and the high byte detector detects more than 5 zeros to be programmed into the flash cell array.

FIG. 4 illustrates a sequence for word mode programming in which the program control state machine 10 selects the groups 0–3 when the low byte detector 20 detects 5 or fewer zeros to be programmed and the high byte detector 21 detects more than 5 zeros to be programmed into the flash cell array 120. In this sequence, the program control state machine 10 activates groups0 and 1 between times t6 and t7, followed by group2 between times t7 and t8, and followed by group3 between times t8 and t9.

Figure 5:
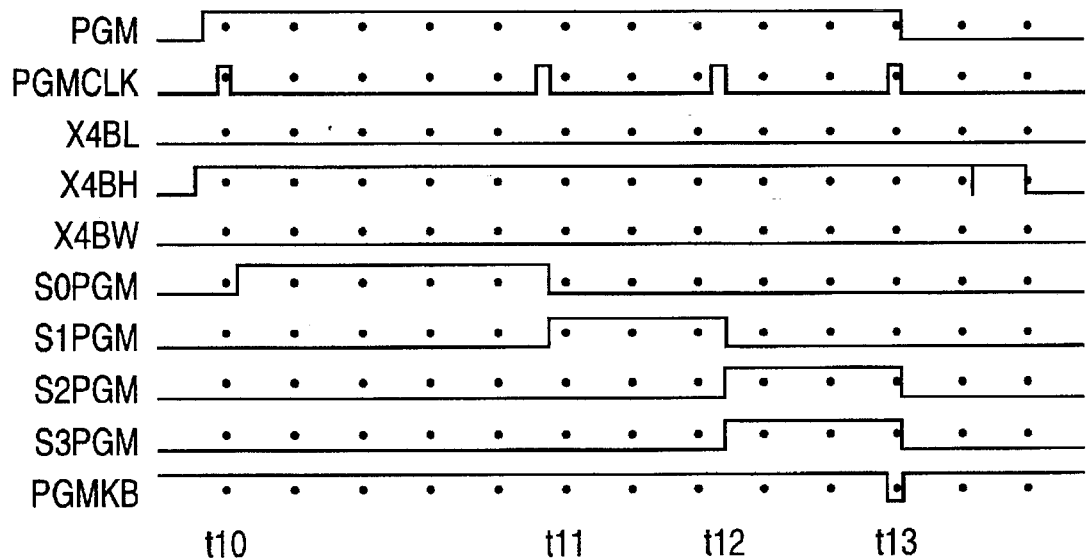
FIG. 5 illustrates a sequence in which the program control state machine selects the groups 0–3 when the low byte detector detects more than 5 zeros to be programmed while the high byte detector detects 5 or fewer zeros to be programmed into the flash cell array.

FIG. 5 illustrates a sequence for word mode programming in which the program control state machine 10 selects the groups 0–3 when the low byte detector 20 detects more than 5 zeros to be programmed while the high byte detector 21 detects 5 or fewer zeros to be programmed into the flash cell array 120 In this sequence, the program control state machine 10 activates the group 0 between times t10 and t11, followed by the group 1 between times t11 and t12. After completion of the group 0 and 1 programming, the program control state machine 10 activates groups2 and 3 simultaneously between times t12 and t13 to complete the programming sequence.

Figure 6:
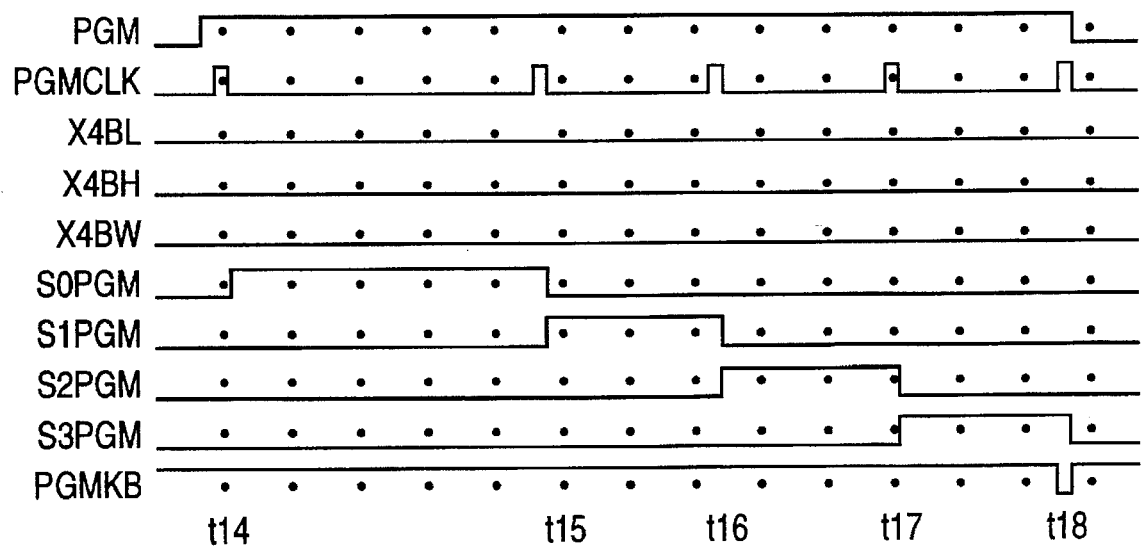
FIG. 6 illustrates a sequence in which the program control state machine selects the groups 0–3 when the low byte detector detects more than 5 zeros to be programmed while the high byte detector also detects more than 5 zeros to be programmed into the flash cell array.

FIG. 6 illustrates a sequence for word mode programming in which the program control state machine 10 selects the groups 0–3 when the low byte detector 20 detects more than 5 zeros to be programmed while the high byte detector 21 also detects more than 5 zeros to be programmed into the flash cell array 120. In this case, the program control state machine 10 sequentially activates the groups 0–3 in separate intervals. The program control state machine 10 activates group0 between times t14 and t15, group1 between times t15 and t16, group2 between times t16 and t17, and group3 between times t17 and t18.

FIG. 7 illustrates the states of the program control state machine 10 for both byte mode and word mode programming on the flash cell array 120. The low byte det. column indicates the state of the X4BL control signal, the high byte det. column indicates the state of the X4BH control signal, and the word det. column indicates the state of the X4BW control signal. Each programming sequence may contain up to 4 program subpulses referred to as the first PGM subpulse through the fourth PGM subpulse. During each subpulse the states of the program control state machine 10 are indicated by states S0 through S3 which correspond to the control signals S0PGM through S3PGM.

As discussed above with respect to FIGS. 2–6, the word mode of the program control state machine 10 yields 5 possible programming sequences. In the byte mode, high byte programming and low byte programming each include two possible programming sequences as indicated in FIG. 7.

Figure 8:
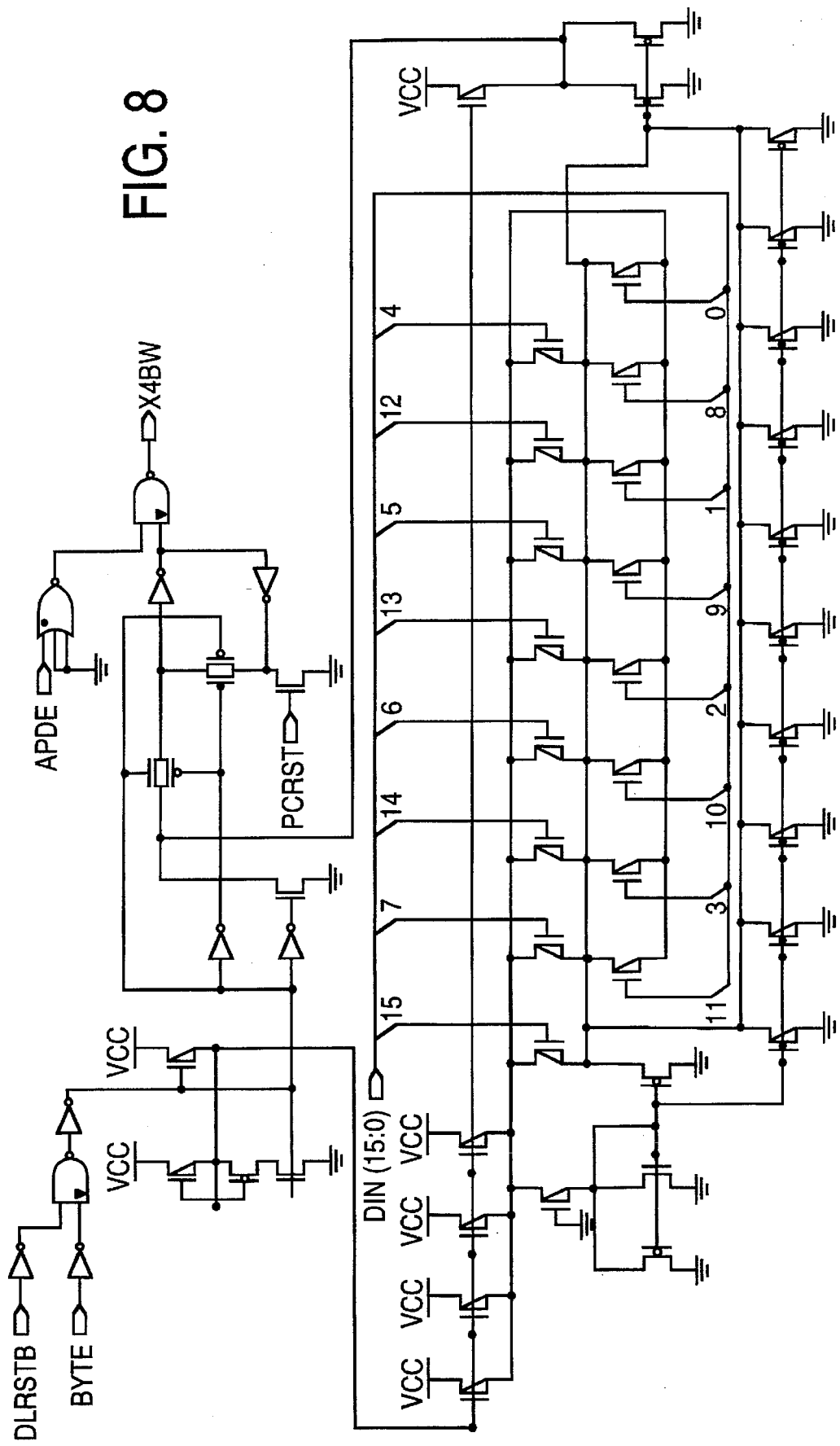
FIG. 8 is a schematic of the word detector in one embodiment.

FIG. 8 is a schematic of the word detector 22 in one embodiment. The word detector 22 includes an analog summing circuit that determines the numbers of zeros indicated on the DIN(15:0) signal lines.

Figure 9:
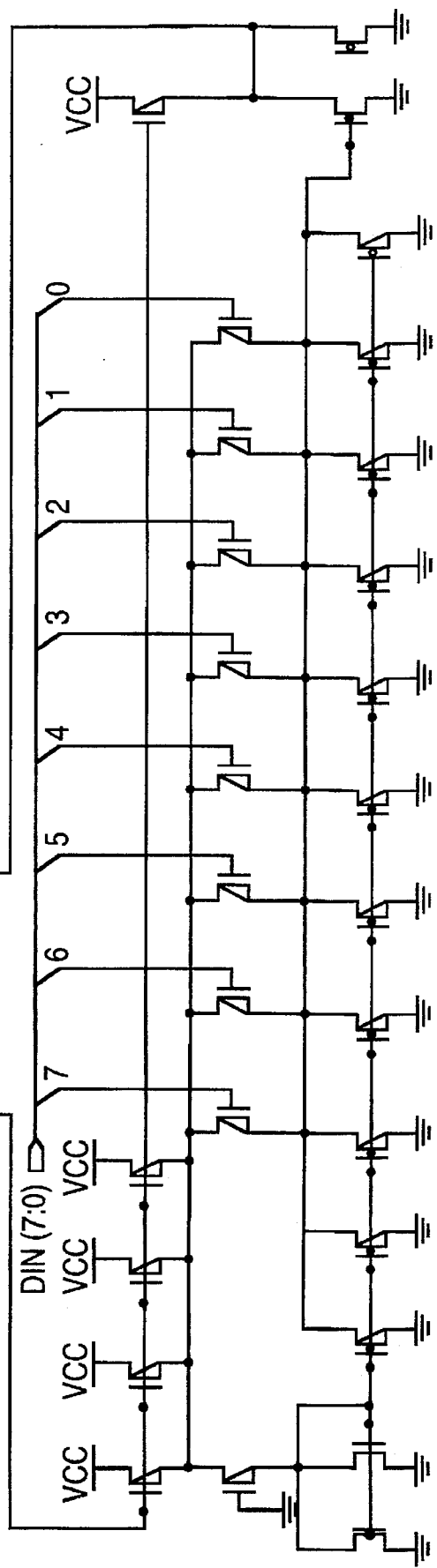
FIG. 9 is a schematic diagram of the low byte detector in one embodiment.
Figure 9:
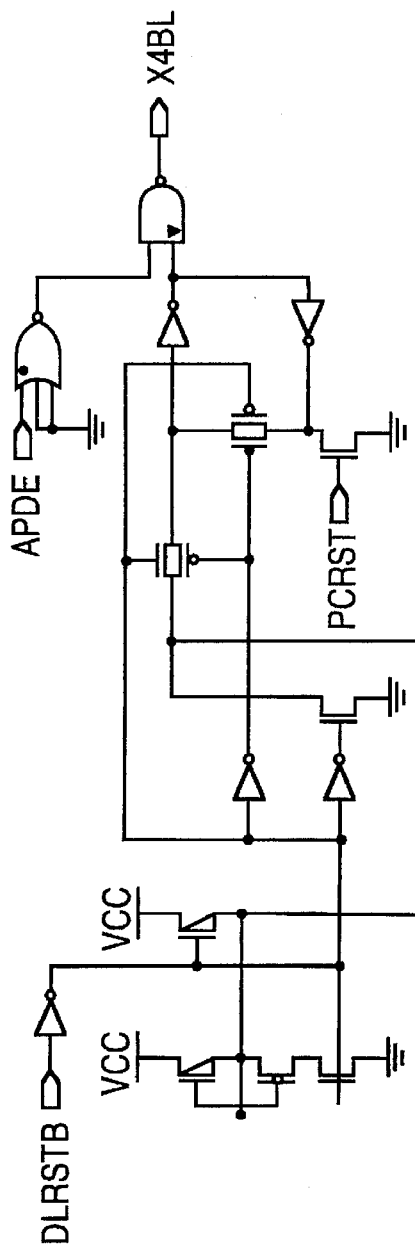
Figure 10:
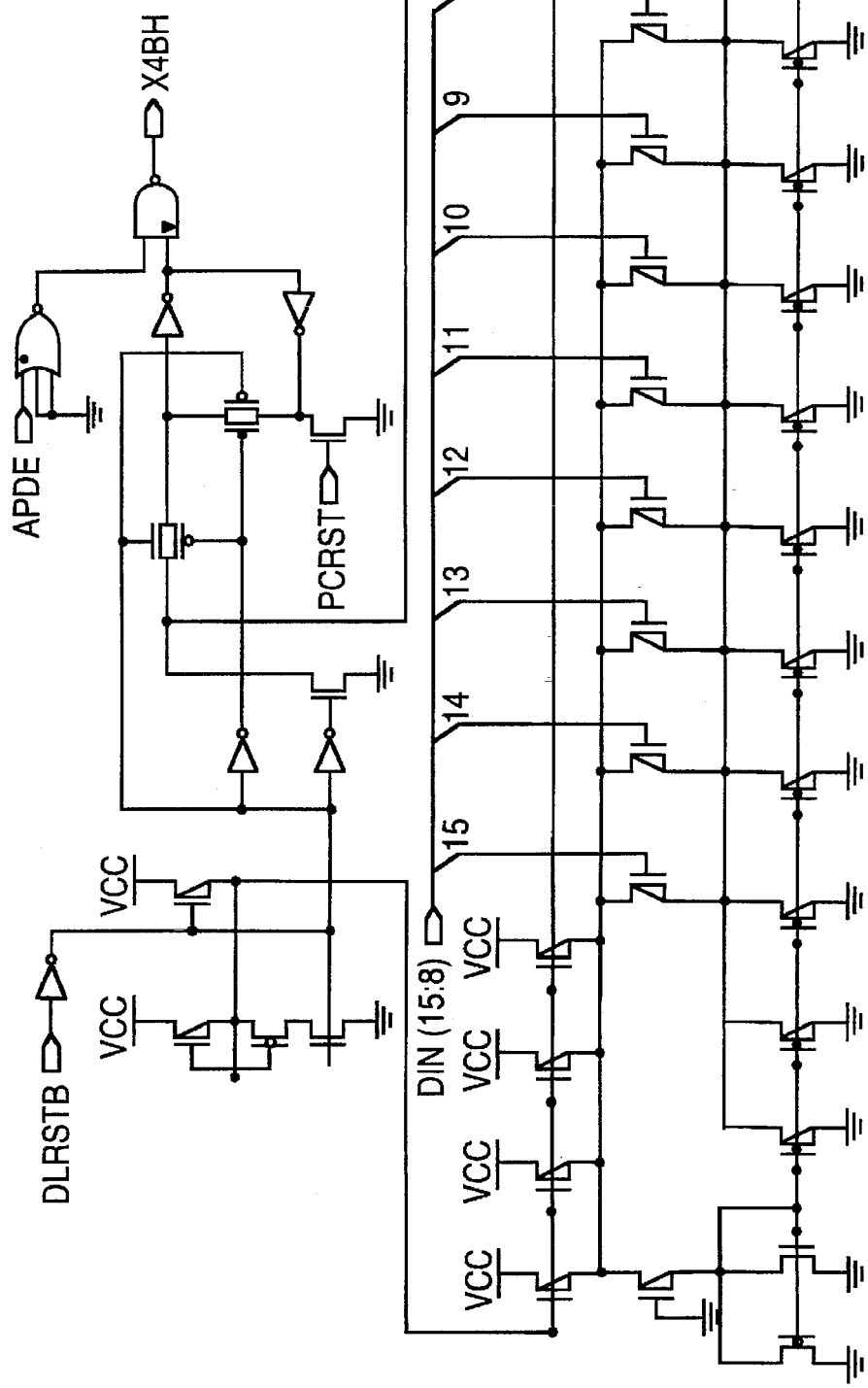
FIG. 10 is a schematic diagram of the high byte detector in one embodiment.

FIGS. 9 and 10 are schematic diagrams of the low byte detector 20 and the high byte detector 21 respectively. The low byte detector 20 and the high byte detector 21 each contain an analog summing circuit which determines the number of zeros in the corresponding input data lines DIN(7:0) or DIN(15:8).

Figure 11:
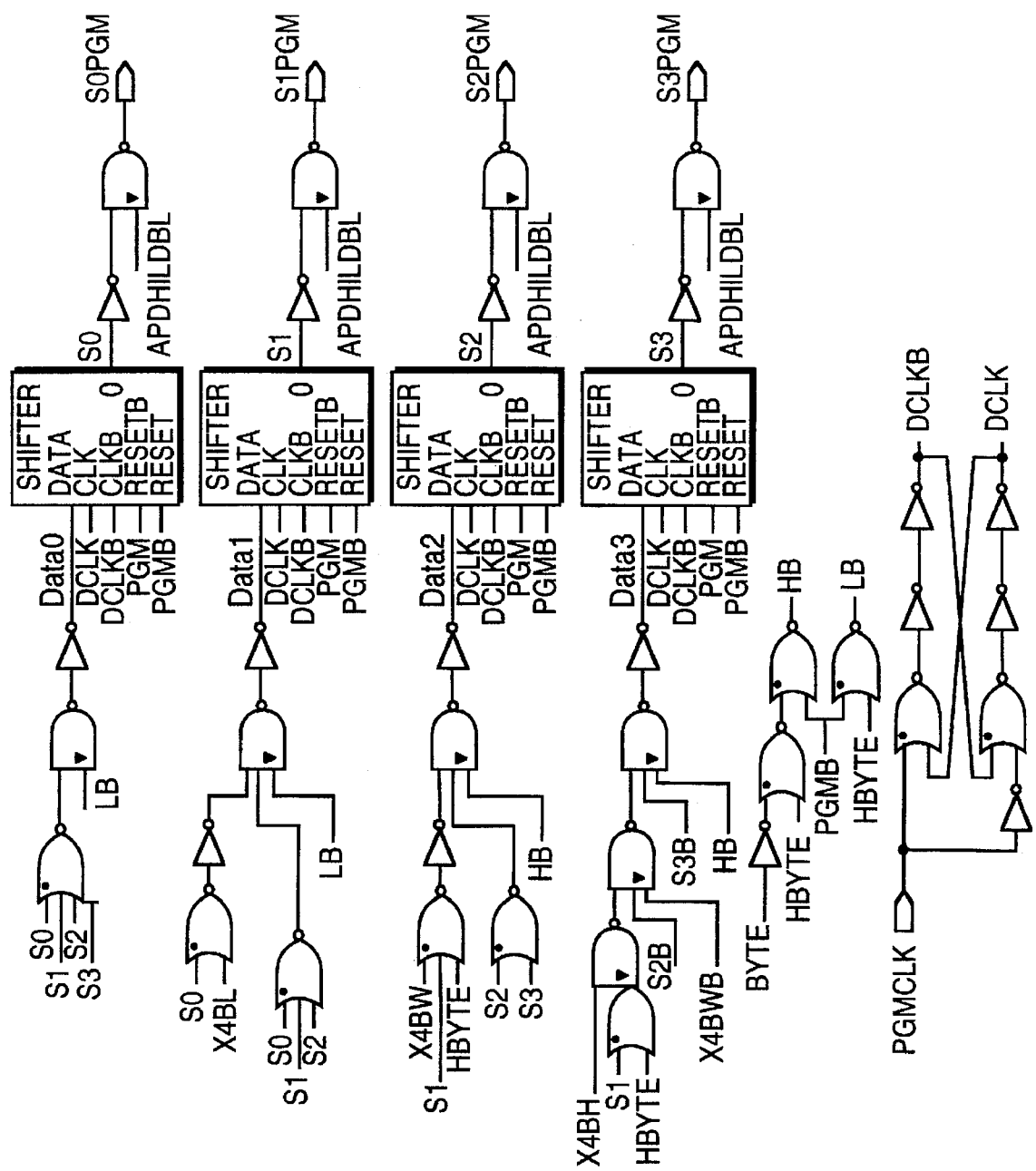
FIG. 11 is a schematic diagram of the program control state machine in one embodiment.

FIG. 11 is a schematic diagram of the program control state machine 10 in one embodiment. The states S0 through S3 indicate the next state for the program control state machine.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A programming method for a memory, comprising the steps of:

subdividing programming circuitry in the memory into a set of groups;

detecting a number of logic zeros to be programmed into a cell array by each group;

switching among the groups such that a number of simultaneously programmed cells in the cell array does not exceed a predetermined number while using maximum available programming current provided by a low voltage, single power supply.

2. The programming method of claim 1, wherein the step of detecting a number of logic zeros comprises the step of detecting a number of logic zeros contained in a program byte targeted for the cell array.

3. The programming method of claim 2, wherein the program byte comprises a high byte of the cell array.

4. The programming method of claim 2, wherein the program byte comprises a low byte of the cell array.

5. The programming method of claim 1, wherein the step of detecting a number of logic zeros comprises the step of detecting a number of logic zeros contained in a program word targeted for the cell array.

6. The programming method of claim 1, wherein the memory is a low voltage single power supply flash memory.

7. A memory, comprising:

a single, low voltage power supply;

programming circuitry arranged into a set of separately controllable groups;

detection circuitry that detects a number of logic zeros to be programmed into a cell array by each group;

circuitry that switches among the groups such that a number of simultaneously programmed cells in the cell array does not exceed a predetermined number while using maximum available programming current generated by the low voltage power supply.

8. The memory of claim 7, wherein the circuitry that switches among the groups comprises a state machine.

9. The memory of claim 7, wherein the detection circuitry determines a number of logic zeros contained in a program byte targeted for the cell array.

10. The memory of claim 9, wherein the program byte comprises a high byte of the cell array.

11. The memory of claim 9, wherein the program byte comprises a low byte of the cell array.

12. The memory of claim 7, wherein the detection circuitry determines a number of logic zeros contained in a program word targeted for the cell array.

13. The memory of claim 7, wherein the cell array comprises a flash cell array for a low voltage single power supply flash memory.

14. The memory of claim 7, wherein the low voltage supply has a value in the range of 2.7 volts–3.0 volts.

* * * * *